US006963195B1

(12) United States Patent
Berkcan

(10) Patent No.: US 6,963,195 B1
(45) Date of Patent: Nov. 8, 2005

(54) APPARATUS FOR SENSING CURRENT

(75) Inventor: Ertugrul Berkcan, Schenectady, NY (US)

(73) Assignee: General Electric Company, Niskayuna, NY (US)

( * ) Notice: Subject to any disclaimer, the term of this patent is extended or adjusted under 35 U.S.C. 154(b) by 841 days.

(21) Appl. No.: 09/715,703

(22) Filed: Nov. 20, 2000

Related U.S. Application Data

(60) Provisional application No. 60/055,903, filed on Aug. 15, 1997.

(51) Int. Cl.[7] .............................................. G01R 33/00
(52) U.S. Cl. .................... 324/117 R; 324/127
(58) Field of Search ....................... 324/117 R, 117 H, 324/127, 256, 258, 126, 133; 336/174

(56) References Cited

U.S. PATENT DOCUMENTS

| | | | | |
|---|---|---|---|---|
| 4,354,154 A | * | 10/1982 | Schiemann | 324/126 |
| 4,786,862 A | * | 11/1988 | Sieron | 324/126 |
| 4,791,361 A | * | 12/1988 | Beiloff et al. | 324/126 |
| 5,055,771 A | * | 10/1991 | Gamble et al. | 327/117 R |
| 5,717,326 A | * | 2/1998 | Moriwaki | 324/117 H |

* cited by examiner

Primary Examiner—Edward Lefkowitz
Assistant Examiner—Subhash Zaveri
(74) Attorney, Agent, or Firm—Patrick K. Patnode; Christian G. Cabou

(57) ABSTRACT

A current sensor assembly includes a sensor coil, an electrostatic shield coil, a core, a housing, and a magnetic shield. The sensing coil, electrostatic shield coil, core, housing, and magnetic shield can be of toroidal symmetry and arranged coaxially about a pair of primary current conductors. The conductors can be either asymmetric or symmetric with respect to the geometric center of the remaining sensor assembly. The core and a secondary winding make up a current sensor. The core is cylindrically shaped and fabricated of non-magnetic material. The secondary winding is wound over the cylindrical core to form a toroidally shaped winding. When assembled into the current sensor assembly, the core and windings are disposed around two single turn primary windings through which AC currents to be measured flow. Alternatively, the conductor can be flat and the sensor can be a solid state sensor that includes an electrostatic shield. The conductor can have a magnetic flux concentrator positioned about the conductor in the same region where the sensor is located.

17 Claims, 14 Drawing Sheets

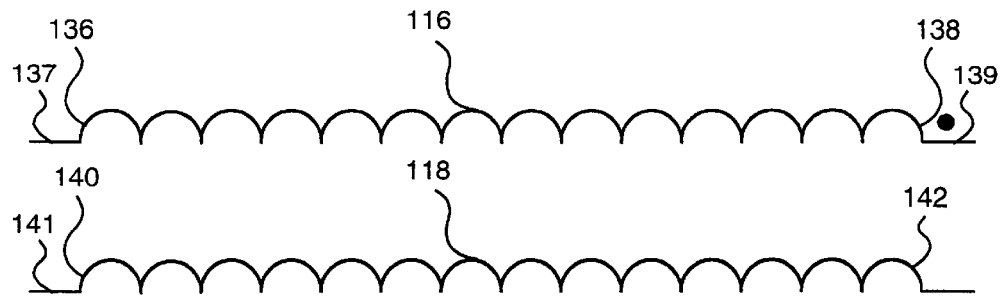
FIG. 6
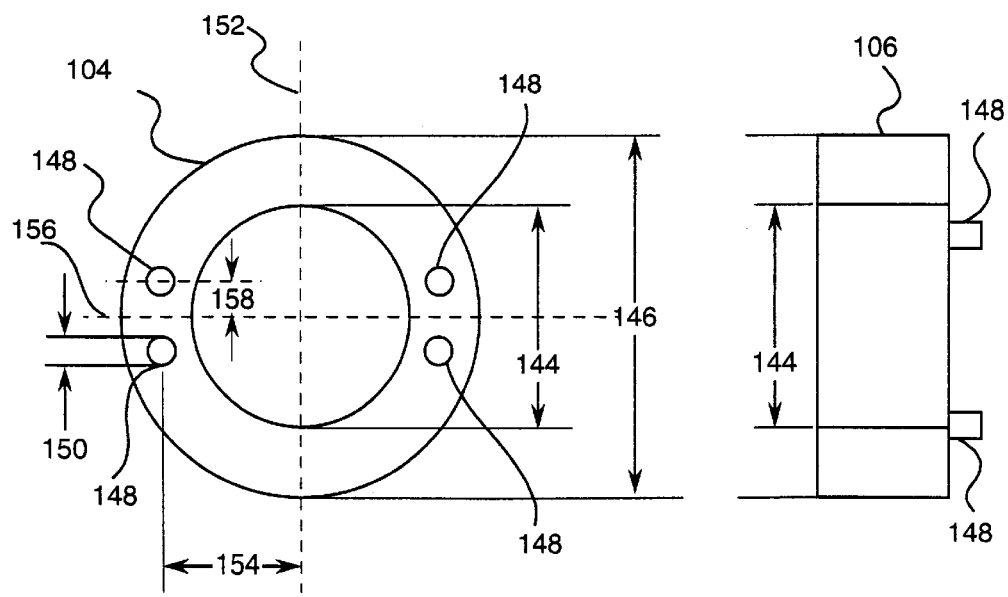
FIG. 7A  FIG. 7B

APPARATUS FOR SENSING CURRENT

CROSS REFERENCE TO RELATED APPLICATION

This application is a division of application Ser. No. 09/133,646 filed Aug. 13, 1998 which is hereby incorporated by reference in its entirety.

This Application claims the benefit of U.S. Provisional Application No. 60/055,903, filed Aug. 15, 1997.

FIELD OF THE INVENTION

This invention relates generally to sensing power line current and, more particularly, to a current sensor responsive to magnetic fields.

BACKGROUND OF THE INVENTION

Power distribution systems include many electrical devices. Some of the electrical devices have current sensors for sensing current flow in a conductor. For example, power distribution systems generally include circuit breakers, electricity meters, and monitoring equipment. The accuracy of such current sensors is important, since inaccurate current sensing could lead to unnecessarily cutting-off power to a load and discrepancies and inaccuracies in power metering, which are undesirable. Although known sensors provide acceptable results, it would be desirable to even further improve the sensing accuracy of current sensors and to reduce costs.

In addition to high accuracy and low cost, the size of current sensors often is important. For example, if products must be redesigned in order to incorporate a new current sensor, the cost of adding the new current sensor to the product can be very expensive. Preferably, any new current sensor is sized so that the sensor can be easily installed into existing units, such as meters and circuit breakers. Further, since many power system components do not include batteries, the current sensor also should be extendible to provide self power. This generally means that any power required by the current sensing circuit and other electronic components in the breaker unit be provided by the power line being monitored rather than from an external battery.

It would be desirable to provide a current sensor assembly that is accurate and of small size. It would be further desirable to provide a semiconductor current sensor that is responsive to a magnetic field in the plane of a chip.

SUMMARY OF THE INVENTION

The foregoing benefits and advantages may be attained by a current sensor assembly including a sensor coil, an electrostatic shield coil, a core, a housing, and a magnetic shield. The sensing coil, electrostatic shield coil, core, housing, and magnetic shield are of toroidal symmetry and are arranged coaxially about a pair of primary current conductors. The conductors can be either asymmetrical or symmetrical with respect to the geometric center of the remaining sensor assembly. The core and a secondary winding make up a current sensor.

The core is toroidal in shape and is of non-magnetic material having a magnetic permeability substantially equal to that of air, and is therefore referred to as an air core. The secondary winding is wound over the cylindrical core to form a toroidally shaped winding. When assembled into the current sensor assembly, the core and windings are disposed around two single turn primary windings for the residential metering applications. AC currents to be measured flow in the primary windings, creating an alternating magnetic flux in the core. This flux induces a voltage in the secondary winding which is coupled to the input of an amplifier and an integrator. The amplifier and integrator are contained within the electronic circuitry of the meter.

The current sensor assembly detects the value of current in a conductor by using either a toroidal winding or a semiconductor (or solid state) based sensor that is responsive to a magnetic field in the plane of the chip. The sensor assembly can be used in residential electronic meters, circuit breakers, and various monitoring equipment and electronics. Aside from the residential electronic meters, the other aforementioned sensor applications may employ different configurations of the primary conductors such as a single primary winding.

BRIEF DESCRIPTION OF THE DRAWINGS

FIG. 6 is a schematic illustration of the sensing coil winding and electrostatic shield coil winding shown in FIG. 1.

FIG. 7A is a top view of the sensor housing shown in FIG. 1.

FIG. 7B is a side view of the sensor housing shown in FIG. 7A.

DETAILED DESCRIPTION

Figure 1:
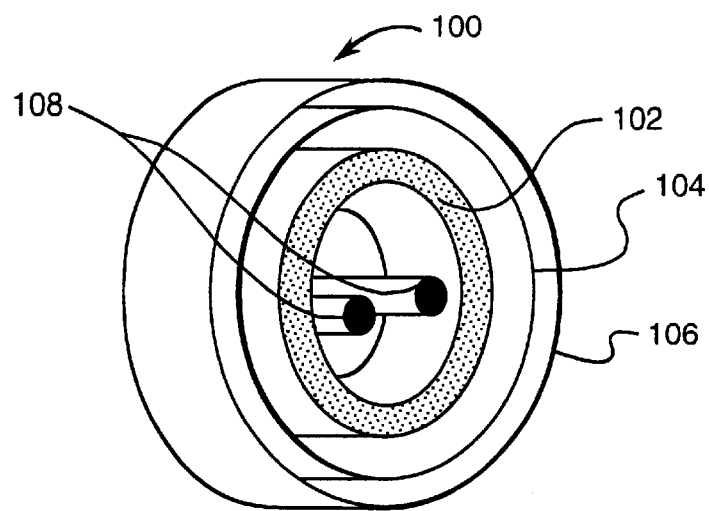
FIG. 1 is a schematic illustration of an asymmetric current sensor assembly according to one embodiment of the present invention.

FIG. 1 illustrates an asymmetric sensor assembly 100 which includes a sensor 102, a housing 104 positioned around sensor 102, and a magnetic shield 106 positioned around housing 104. Sensor 102, housing 104, and magnetic shield 106 are of toroidal symmetry and arranged coaxially about a pair of asymmetric primary current conductors 108. Conductors 108 are disposed side-by-side such that the center of the line joining the centers of the conductors is at the geometric center of the remaining toroidal assembly. This relative position is registered by use of simple attachments or a registration part (not shown in FIG. 1 for clarity), that maintain the appropriate relative positional relationships of sensor assembly 100.

Figure 2:
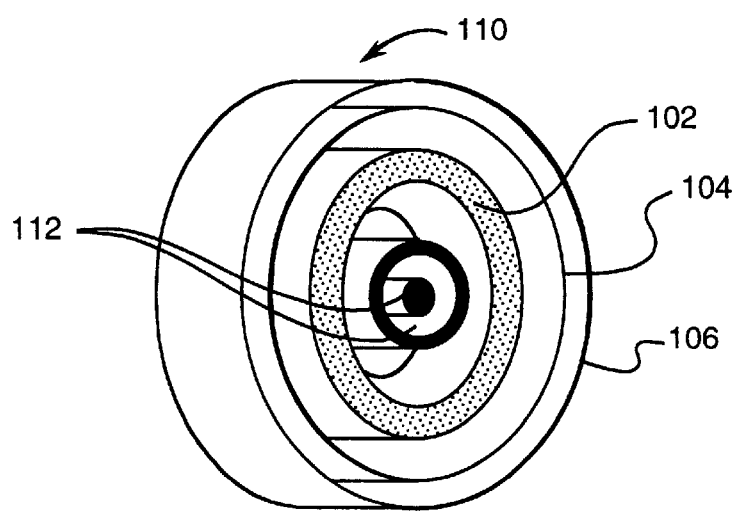
FIG. 2 is a schematic illustration of a symmetric current sensor assembly according to another embodiment of the present invention.

FIG. 2 illustrates another embodiment of a symmetric sensor assembly 110 which includes sensor 102, housing 104 positioned around sensor 102, and magnetic shield 106 positioned around housing 104. Sensor 102, housing 104, and magnetic shield 106 are of toroidal symmetry and arranged coaxially about a pair of symmetric primary current conductors 112. Conductors 112 are disposed concentrically such that their common center is at the geometric center of the remaining sensor assembly 110. As described above, this relative position is registered by use of simple attachments or a registration part (not shown in FIG. 2 for clarity) that maintain the appropriate relative positional relationships of sensor assembly 110.

Figure 3:
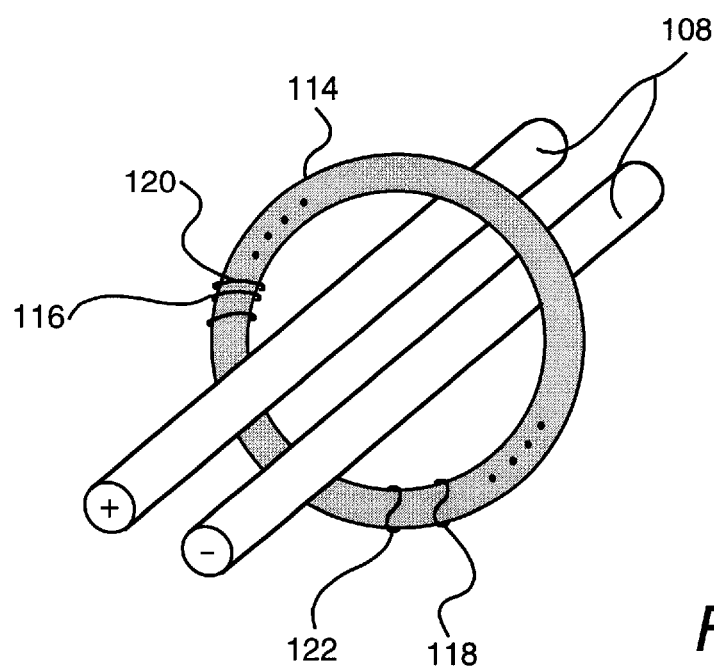
FIG. 3 is a general perspective view of a core and winding.

FIG. 3 illustrates sensor 102 including a core 114, a sensing winding 116, and an electrostatic shield winding 118. Core 114 has the same magnetic permeability $\mu_0$ as that of air and is therefore sometimes referred to as an air core. Winding 116 is wound around core 114 to form a sensing coil 120. Sensing coil 120 is known as a Rogowski coil or a Maxwell worm. A Rogowski coil or a Maxwell worm is a coil of constant cross sectional area uniformly wound on a non-magnetic former shaped into a closed loop to surround a current-carrying conductor. Among the reasons for using a Rogowski coil is that a Rogowski coil provides an isolated current measurement and is not sensitive to DC components. A Rogowski coil also does not saturate with high fields, and has excellent bandwidth and linearity. Electrostatic shield winding 120 is wound around winding 116 to form an electrostatic shield coil 122. Electrostatic shield coil 122 is used to eliminate the effect of electrostatic coupling from/to conductors 108, 112 carrying the current to be sensed. Use of electrostatic shield coil 122 has the benefits of reducing the capacitive coupling in the presence of rapidly changing electric fields due to high dI/dt in conductors 108, 112.

An important parameter for sensor 102 is turn density or number of turns per unit length. Accuracy of sensor assemblies 100, 110, as well as their sensitivity to various parameters (such as dimensional variations, external fields, etc), depends on smoothness of the turn density.

Sensor 102 is used to detect the time rate of change of a magnetic field created by current-carrying conductors 108, 112. This detection is obtained from the time rate of change of the flux by using Faraday's law in Equation 1:

$$V_{sens} = \frac{d}{dt}\Phi \qquad (1)$$

where $\Phi$ is the flux of the magnetic field created by the currents to be sensed. Voltage $V_{sens}$ is directly and substantially proportional to the time rate of change of the currents as shown in Equation 2:

$$V_{sens}(t) = \mu_0 n A \frac{d}{dt}(I_1(t) + I_2(t)), \qquad (2)$$

where n is turn density or number of turns per unit length, A is the cross sectional area of the coil, and $\mu_0$ is the magnetic permeability of air. This relationship follows directly from Ampere's law; consequently the relationship is not greatly affected by coil shape, turn shape, nor position of sensor coil 120 relative to conductors 108, 112, to a certain degree. The closed loop does not, in principle, need to be circular.

Equation (2) can be written with a mutual inductance parameter M as:

$$V_{sens}(t) = M\frac{d}{dt}(I_1(t) + I_2(t)), \qquad (3)$$

where the term M represents the sensitivity of sensor coil 120 in $[V_{sens}]$=Volt*sec/Amp.

Figure 4:
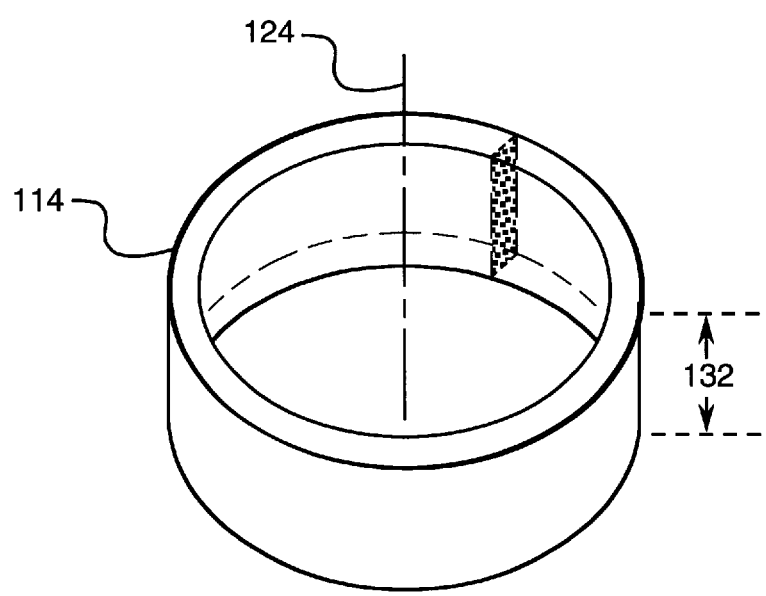
FIG. 4 is a perspective view of the core shown in FIG. 3.
Figure 5:
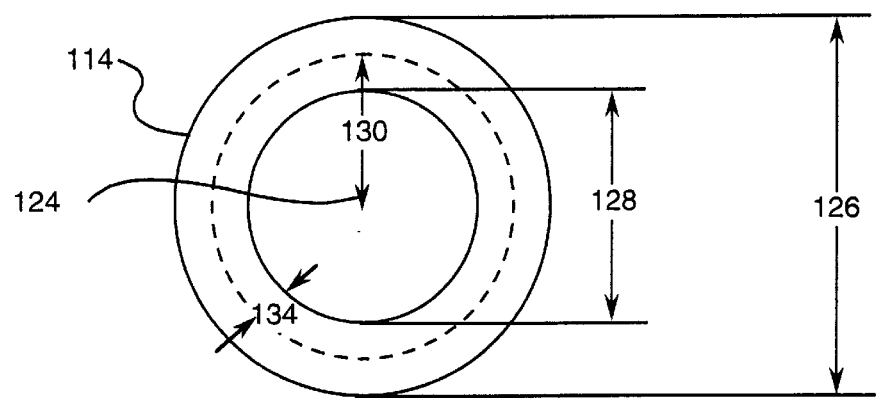
FIG. 5 is a top view of the core shown in FIG. 4.

FIGS. 4 and 5 illustrate, in perspective and top views, respectively, core 114 on which is wound the turns of sensing coil 120 and the turns of electrostatic shield coil 122. In one embodiment, core 114 has a generally rectangular cross sectional geometry defined by Equation 4:

$$r \equiv \frac{OD + ID}{2}; \alpha \equiv \frac{OD - ID}{2} \qquad (4)$$

where the core has an axis 124, an outer diameter (OD) 126, an inner diameter (ID) 128, a central radius (r) 130, a width (w) 132, and an inner half thickness ($\alpha$) 134. In one embodiment, core 114 is of non-magnetic material with a permeability approximately equal to that of air. Table 1 lists materials sizes for use in fabrication of core 114. The ceramic to be used should be either Alumina or Mullite, and the polymer to be used should be Delrin (acetal), or other such polymer with a low temperature coefficient of expansion.

TABLE 1

| Materials | Ceramic and Polymer |
|---|---|
| ID | 1" |
| OD | 1½" |
| w | ½" |
| thickness | ¼" |
| α | ⅛" |
| Tolerances | Å0.0005" |

FIG. 6 illustrates sensing winding 116 used in fabricating sensing coil 120. Winding 116 has first and second ends 136 and 138, respectively. In order for the sensor assemblies to properly determine the magnitude of the current, winding 116 should be accurate and precise. In one embodiment, winding 116 is wound such that ends 136 and 138 are connected to terminals 137 and 139, respectively. FIG. 6 also illustrates electrostatic shield winding 118 of electrostatic shield coil 122 (FIG. 3). Winding 118 has first and second ends 140 and 142, respectively. In one embodiment, winding 118 is a single layer. Winding 118 is wound such that end 140 is connected to terminal 141 and end 142 is unterminated, i.e., not connected.

FIGS. 7A and 7B are top and side views, respectively, of housing 104, illustrating one of two basic configurations for sensor housing 104. The two configurations are largely distinguished by the registration assembly.

The dimensions of housing 104 are listed in Table 2.

TABLE 2

| | |
|---|---|
| OD | 1.675 |
| ID | 0.8" |
| a | 0.6" |
| b | 0.3" |
| r | 0.15" |
| Tolerances | 0.005" |

Housing 104 has an inner diameter (ID) 144, an outer diameter (OD) 146, and projections 148 having a diameter (r) 150. Projections 148 are separated from a first centerline 152 of housing 104 by a first distance (a) 154. Projections 148 are separated from a second centerline 156 by a second distance (b) 158.

Figure 8A:
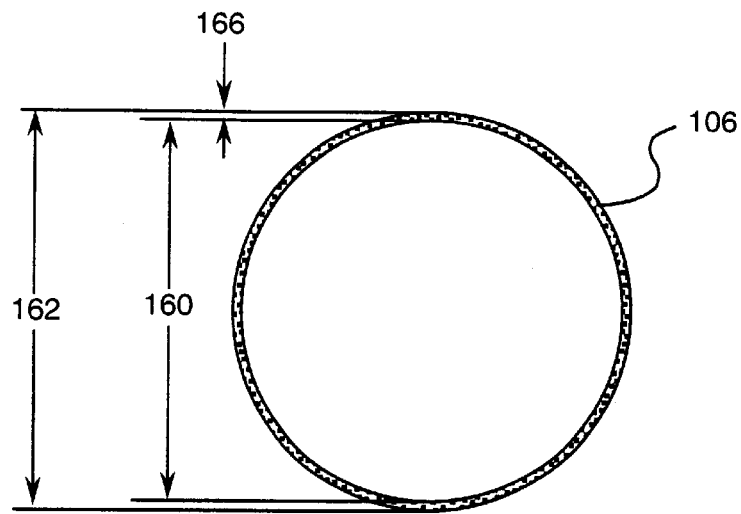
FIG. 8A is a top view of the magnetic shield shown in FIG. 1.
Figure 8B:
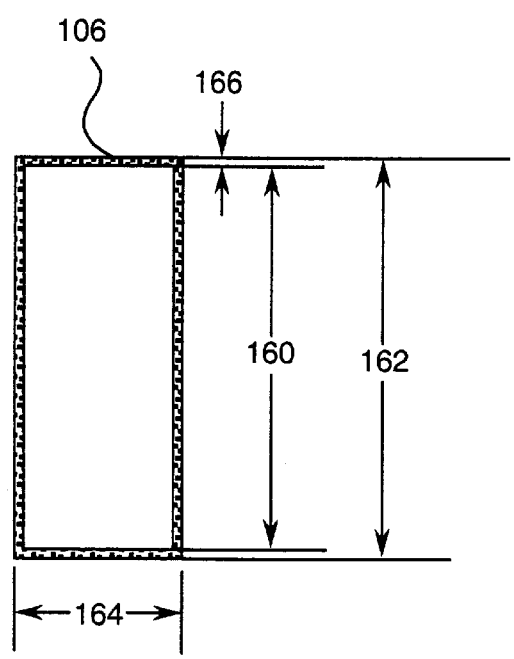
FIG. 8B is a cross sectional view of the magnetic shield shown in FIG. 8A.

FIGS. 8A and 8B are top and cross sectional views, respectively, of magnetic shield 106 in the form of a tape-wound core. Magnetic shield 106 is situated outside housing 104 and, in one embodiment, is comprised of silicon steel of 12 mils thickness. The dimensions of magnetic shield 106, as well as the material to be used, are listed in Table 3. Magnetic shield 106 has an inner diameter, (ID) 160, an outer diameter (OD) 162, a width (w) 164, and a thickness 166.

TABLE 3

| | |
|---|---|
| Material | 12 mils thick silicon steel |
| ID | 1.75" |
| OD | ~1.942" |
| w | ¾" |
| Thickness | ~0.096" |
| Layers | 8 |
| Tolerances | ±0.005" (for ID and Thickness) |

Figure 9:
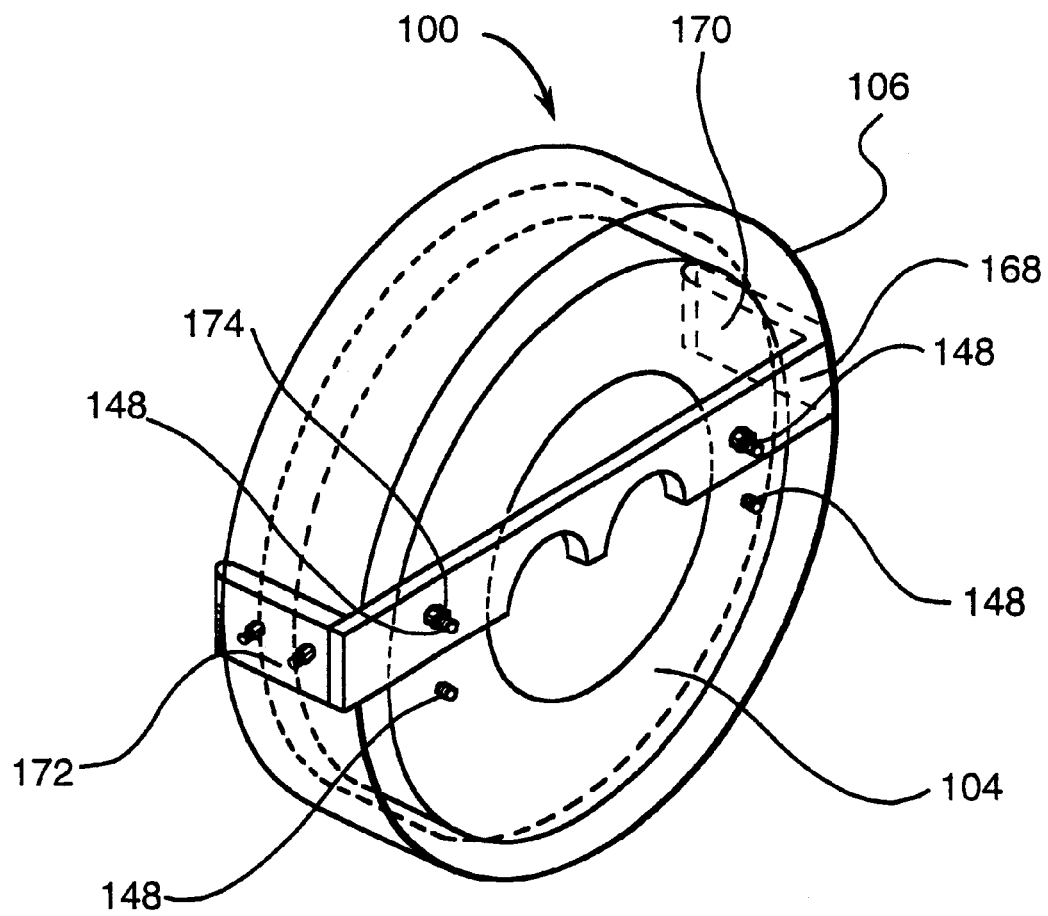
FIG. 9 is a perspective view of the current sensor assembly shown in FIG. 1 including a registration unit.

FIG. 9 is a perspective view of sensor assembly 100 without conductors 108. Sensor assembly 100 includes magnetic shield 106, housing 104, and a registration unit 168. Sensor housing 104 is held in registration with respect to the conductors (not shown) and magnetic shield 106 by using a registration unit 168 having an inner locking mechanism 170 on one side of sensor assembly 100 and an outer locking mechanism 172 on the other side of sensor assembly 100. Registration unit 168 is connected to housing 104 by projections 148 extending through a plurality of openings 174, and is connected to magnetic shield 106 in a similar fashion.

Figure 10:
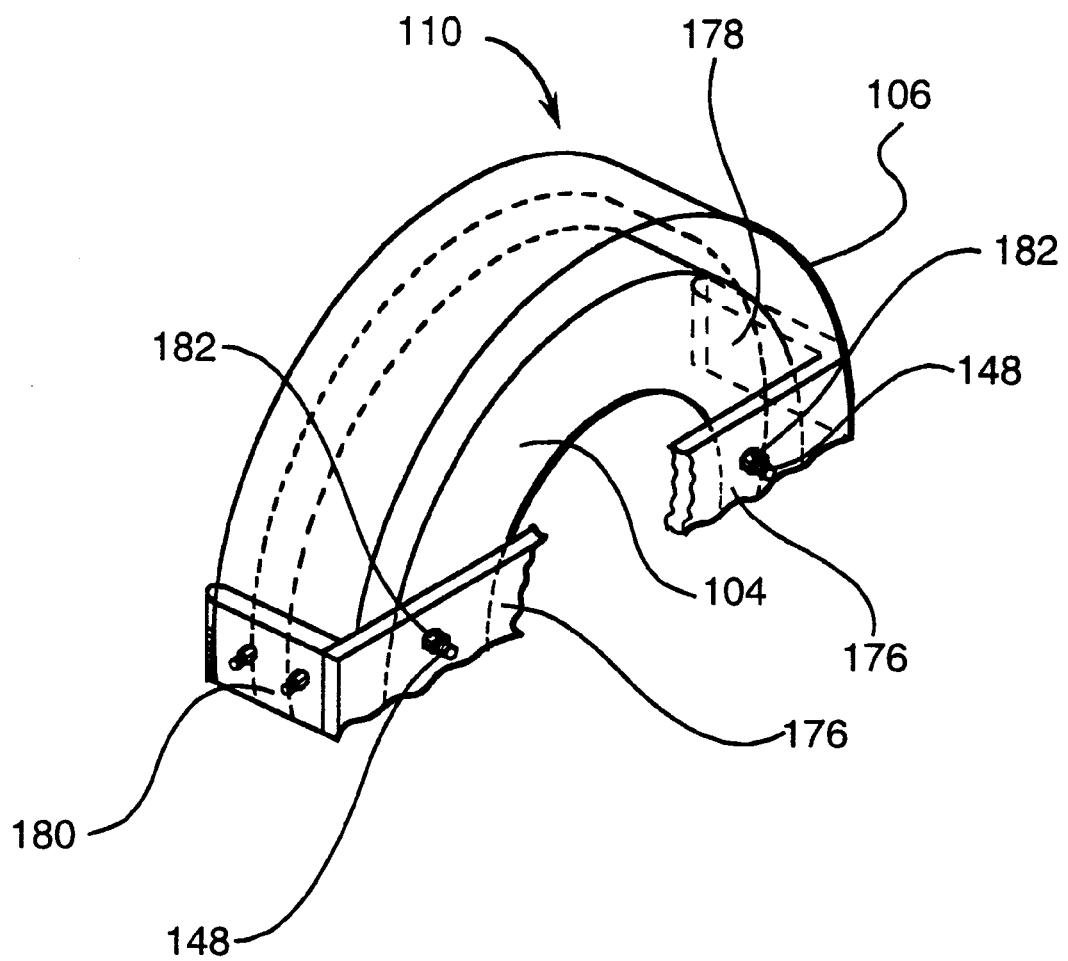
FIG. 10 is a perspective view of part of the current sensor assembly shown in FIG. 2, including a registration unit.

FIG. 10 is a perspective view of sensor assembly 110 without conductors 112. Sensor assembly 110 includes magnetic shield 106, housing 104, and a registration unit 176. Sensor housing 104 is held in registration with respect to the conductors (not shown) and magnetic shield 106 by using a registration unit 176 having an inner locking mechanism 178 on one side of sensor assembly 110 and an outer locking mechanism 180 on the other side of sensor assembly 110. As described above, registration unit 176 is connected to housing 104 by projections 148 extending through a plurality of openings 182, and is connected to magnetic shield 106 in a similar fashion.

Figure 11:
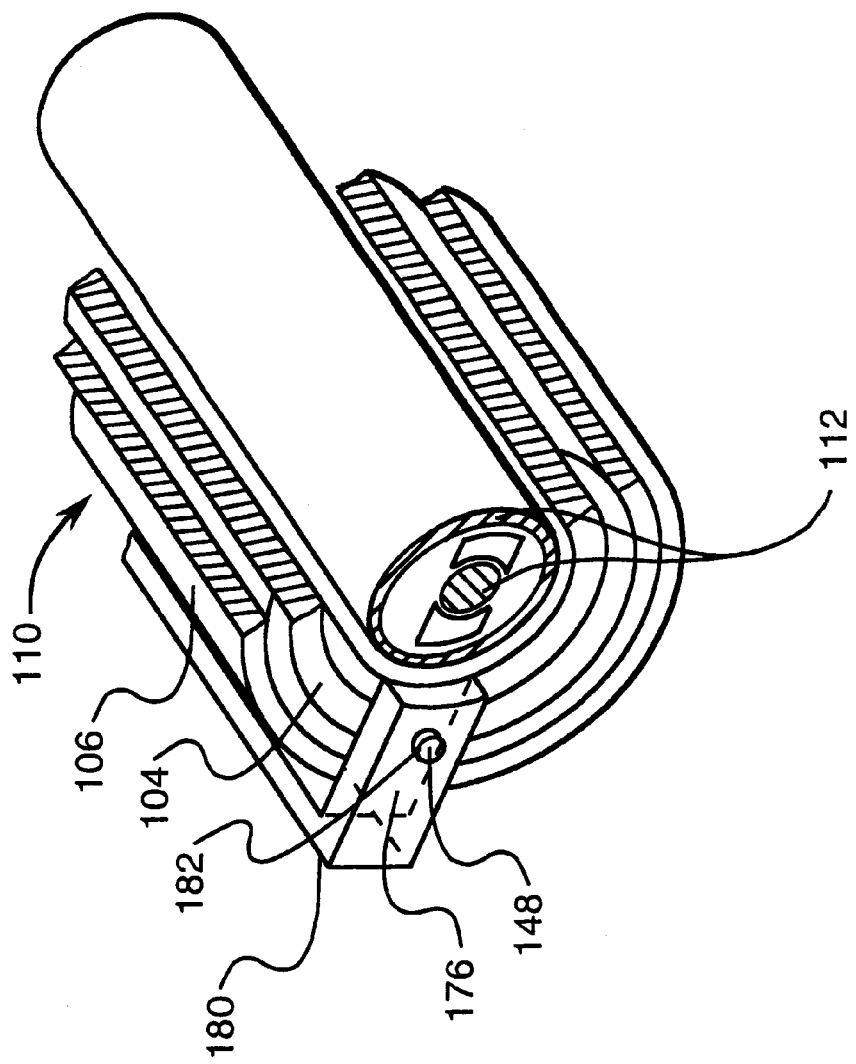
FIG. 11 is a perspective view of part of the current sensor assembly shown in FIG. 2, including the registration unit shown in FIG. 10.

FIG. 11 is a partial perspective view of sensor assembly 110 with conductors 112 stabilized by registration unit 176. As illustrated in FIG. 11, conductors 112 are held in place by the interaction between registration unit 176, housing 104, and magnetic shield 106.

For residential metering applications, sensing coil 120 (FIG. 3) may be terminated by a shielded twisted set of leads (not shown) to connect to the electronics (not shown) and the integration circuitry (not shown). Unless the cable (not shown) connecting sensing coil 120 to the electronics is coaxial and very long, its inductance is very small and can be ignored. Twisting of the leads results in mutually inductive coupling and pick-up being very small as well. Capacitance of the leads is important for high frequency applications since the capacitance of the leads is essentially in parallel with the sensing coil capacitance. These high frequency effects are however beyond a few 10's of harmonics of 60 Hz and can be safely and effectively ignored for this application of 60 Hz only. A damping resistor in parallel with sensing coil 120 is thus not needed to increase the bandwidth of sensor assemblies 100, 110 and to reduce ringing.

Similarly, an integrating resistor in an analog integrator need not be included. Due to presence of an operational amplifier in the integrator, the coaxial cable connected to sensing coil 120 is at zero or ground potential. This maintains the natural bandwidth of coil 120 when long cables or leads are used to connect sensing coil 120 to the integrator. A parallel damping resistor (not shown) can be used to reduce ringing during the qualification testing.

As described above, electrostatic shield coil 122 (FIG. 3) is used to eliminate the effect of electrostatic coupling from/to conductors 108, 112 carrying the current to be sensed. This beneficially reduces the capacitive coupling in the presence of rapidly changing electric fields due to high dI/dt in conductors 108, 112. However, important aspects of electrostatic shield coil 122 must be taken into account. Electrostatic shield 102 must be constructed so as not to form a shorted turn around sensing coil 120. Normally the shield also has a tendency to increase the coil capacitance, and hence reduce bandwidth and damping. This latter aspect however involves the same reasoning as the high frequency properties of sensing coil 120, and can largely be neglected for this application. The material to be used for core 114 should have a relatively small temperature coefficient of expansion since this will directly and adversely affect the temperature coefficient of the sensitivity of sensor assemblies 100, 110.

A high quality but soft polymer, Dow Corning X3-6646 can be used to pot the sensor and electrostatic shield elements. Dow Corning X3-6646 polymer is available from Dow Corning Corporation, P.O. Box 994, Mail # CO2108-GCMS, Midland, Mich. 48686-0994. This polymer can be cured at 125° C. to minimize any temperature effects including high temperature expansion as well as short circuit experimentation. This transparent silicone encapsulant provides good dielectric properties in severe environments. The two components can be mixed in 1:1 ratio (volume or weight) to obtain a self-healing, cushioning gel. This gel can be used to totally fill the housing, including the spaces between the housing and the respective coils. Table 4 details the working range and one set of curing requirements for the X3-6646 polymer.

TABLE 4

| Dow Corning X3-6466 Semiconductor Protective Coating | |
| --- | --- |
| Working Range | −80° C. to +200° C.(−112° F. to 392° F.) |
| Curing Temperature | 125° C. |
| Curing Duration | 12 hours |

A second level of epoxy can then be layered on the outside face of the housing to provide physical protection to the sensor assembly as well as to prevent the gel from becoming lost and unprotected. This latter polymer, STYCAST® 2662 is an epoxy encapsulant that has very high temperature performance as well as outstanding chemical and humidity resistance. STYCAST® 2662 is available from W.R. Grace & Company, 92 Weston Street, Hartford, Conn. 06120. Table 5 details the working range and one set of curing requirements for the 2662 epoxy encapsulant.

TABLE 5

| STYCAST ® 2662 (Catalyst 17) | Epoxy encapsulant |
| --- | --- |
| Working Range | −80° C. to +200° C.(112° F. to 392° F.) |
| Curing Temperature | 100° C. |
| Curing Duration | 4 hours |

Figure 12:
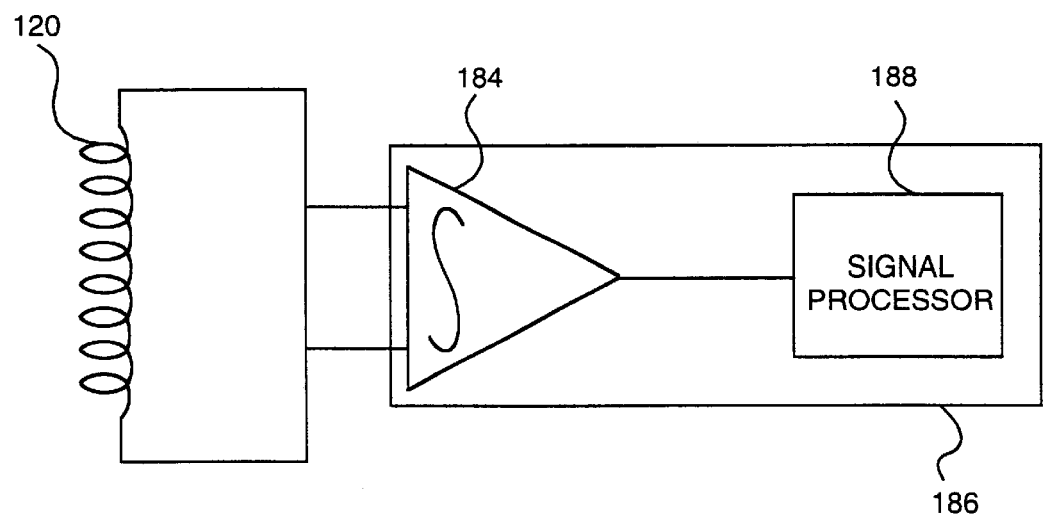
FIG. 12 is a circuit diagram illustrating sensor electronic circuitry.

FIG. 12 illustrates sensor electronic circuitry arranged such that the time rate of change of the flux is detected by an integrator circuit 184. Integrator circuit 184 integrates the time rate of change of the flux to obtain the value of the current to be sensed. The sensor assembly is coupled to a circuit 186 which includes integrator circuit 184 and a digital signal processor 188. Alternatively, processor 188 could be an analog signal processor and a digital signal processor.

Figures 13, 14:
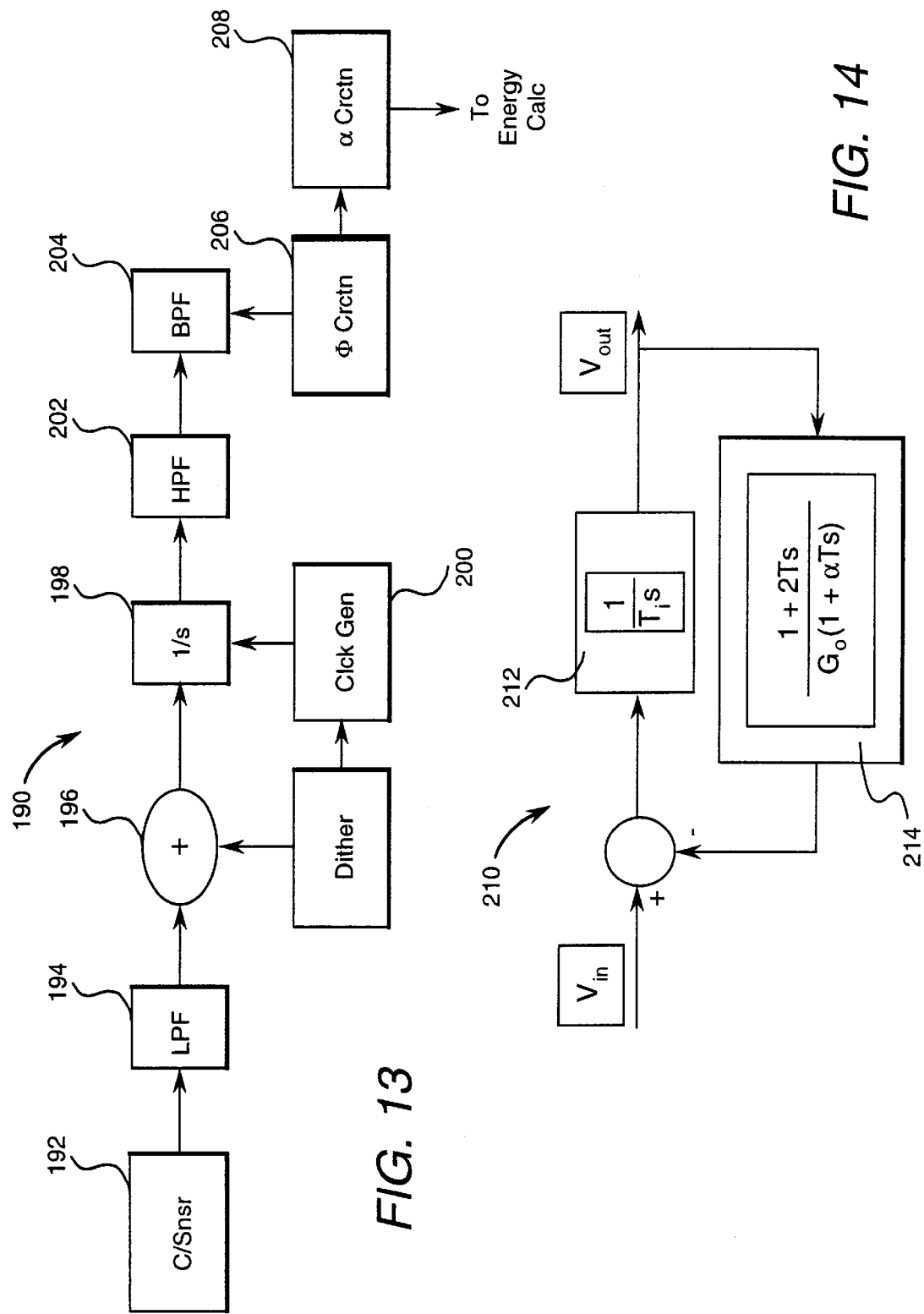
FIG. 13 is a block diagram of a digital integration approach including digital signal processing and error or calibration corrections.
FIG. 14 is a block diagram of an integrator having a feedback path with a lag network.

FIG. 13 illustrates a digital integration system 190 to test the performance of a sensor 192. The output signal from current sensor 192 enters a low pass filter 194 that feeds into an adder 196. Adder 196 is coupled to an integrator 198 that converts the time rate of change of the current, or the time rate of change of the flux, to the current, or the flux, respectively. Integrator 198 uses the explicit requirements of the sensor qualification aspects. A parallel-coupled resistor and integrator capacitor (not shown) are used to provide a low frequency limit to the integrator gain. The resistor assures, for example, that the offset of the operational amplifier (not shown) is not integrated to saturate the output signal of the integrator. The resistor also negates any need for switching schemes to reset the integrator. A clock generator 200 also feeds into integrator 198. The output signal from integrator 198 is directed to a high pass filter 202 and then to a band pass filter 204. System 190 further includes phase correcting apparatus 206 that receives the output signal from band pass filter 204. The output signal from phase correcting apparatus 206 enters a gain correcting apparatus 208 that is coupled to energy calculation apparatus. The sensor performance tests should be carried out with the electronics depicted in FIG. 13 in order to obtain the correct calibration and integration times.

FIG. 14 illustrates an integrator system 210 that achieves an overall sensitivity of 0.125 V/kA.sec. Integrator system 210 includes an integrator 212 and a feedback loop 214. To obtain an overall sensitivity of 0.125 V/kA.sec a very small time constant is required. Furthermore integrator 210 must be capable of working down to frequencies of a fraction of a Hz since sufficiently low phase error is required at 50–60 Hz.

The transfer function for this frequency behavior is given by:

$$\frac{V_{out}}{V_{in}} = \frac{G_0(1 + \alpha Ts)}{(1 + Ts)^2}; \quad (5)$$

where $f_1 = 1/(2"T)$ represents the lower limit of approximate integrator behavior. For frequencies $f \gg f_1$, the transfer function becomes:

$$\frac{V_{out}}{V_{in}} = \frac{1}{T_i s}, \quad (6)$$

$$T_i = \frac{T}{G_0 \alpha}$$

The phase error can be significantly improved by reducing $f_1$, although this reduction might cause an increase in the noise level. As shown above, the signal to noise ratio of the entire sensor assembly is quite good even with very low values of $f_1$. At frequencies below $f_1$, the objective is to sufficiently attenuate the integrator gain to eliminate any thermal drifts. The frequency Characteristics can be achieved by providing the integrator with a lag network on the feedback path as shown in FIG. 14.

The integrator illustrated in FIG. 14 includes a circuit having a feedback path with a lag network. The transfer function of the integrator is thus given by:

$$\frac{V_{out}}{V_{in}} = \frac{G_0(1 + \alpha Ts)}{1 + 2\varsigma Ts + T^2 s^2} \quad (7)$$

$$G_0 = \frac{2R_1}{R_0} \quad (8)$$

$$T = 2\alpha C_1 R_1$$

$$\varsigma = \frac{1}{2} C_2 R_2 + \frac{2C_1 R_1}{T}$$

For frequencies $f > f_1$:

$$\frac{V_{out}}{V_{in}} = \frac{G_0 \alpha}{Ts} = \frac{1}{C_1 R_0 s} \quad (9)$$

As described above, current sensor assemblies 100, 110 include core 114 of non-magnetic material carrying one toroidal secondary winding 116 wound around core 114. When assembled into current sensor assemblies 100, 110, core 114 and windings 116 are disposed around two single turn primary windings 108, 112.

AC currents to be measured flow in primary windings 108, 112, creating an alternating magnetic flux in core 114. This flux induces a voltage in secondary winding 116 which is coupled to the input of an amplifier (not shown) and an integrator (not shown). The amplifier and integrator are not part of current sensor assemblies 100, 110.

Figure 15:
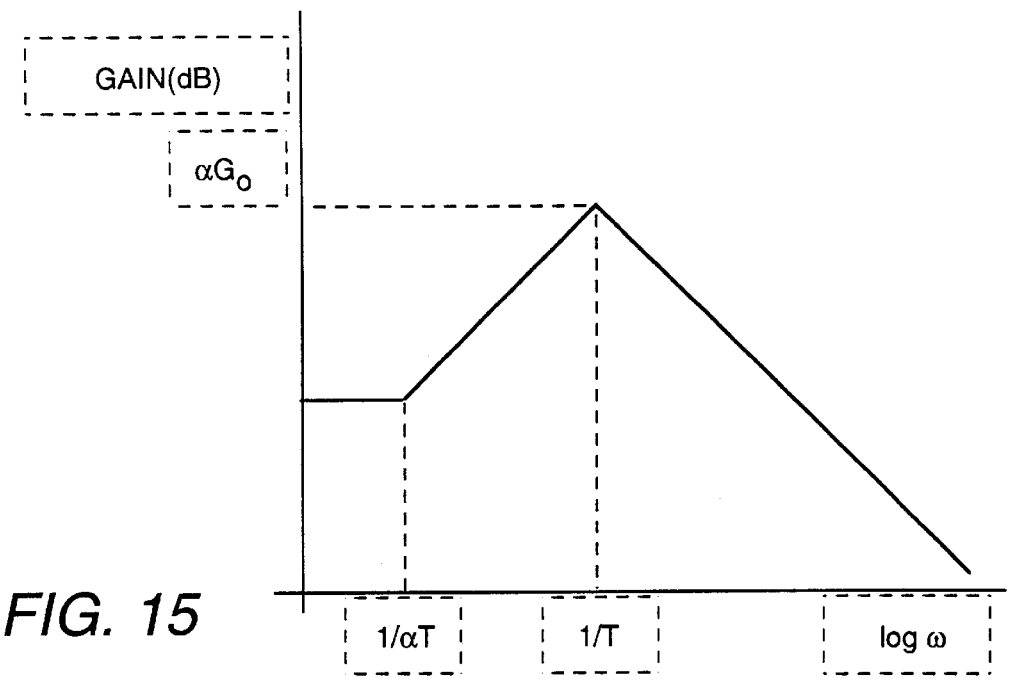
FIG. 15 is a graph depicting gain-frequency characteristics of the integrator shown in FIG. 14.

FIG. 15 is a plot of the integrator function and illustrates a gain-frequency characteristic required by the overall integrator to eliminate the effects of thermal drift in the operational amplifier or other voltages in the coil connections.

Figure 16:
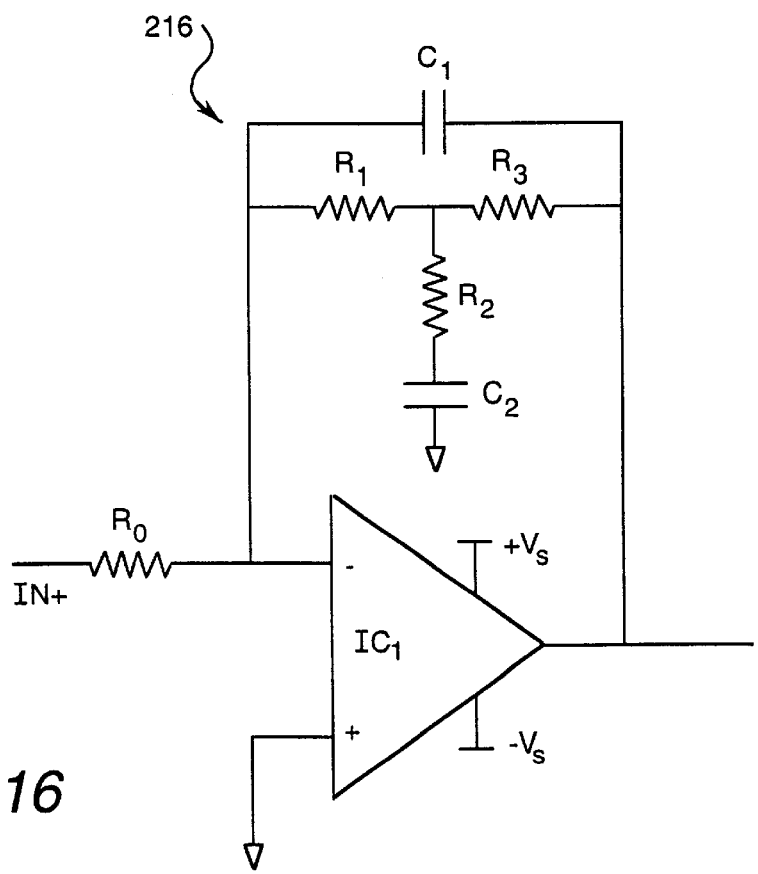
FIG. 16 is a circuit diagram illustrating one embodiment of an integrator.

FIG. 16 illustrates an integrator circuit 216 that includes an operational amplifier $IC_1$ configured as an integrator. Specifically, integrator circuit 216 is a second order low pass integrator for current signals transmitted to integrator circuit 216. Integrator circuit 216 also includes resistors $R_0$, $R_1$, $R_2$, and $R_3$ and capacitors $C_1$, and $C_2$.

Resistors $R_0$ and $R_1$ and capacitor $C_1$ are connected to the negative input of amplifier $IC_1$. Resistor $R_3$ and capacitor $C_1$ are connected to the output of amplifier $IC_1$. The junction of resistor $R_1$ and resistor $R_3$ is connected to resistor $R_2$. Resistor $R_2$ is connected to capacitor $C_2$. Capacitor $C_2$ and the positive input of amplifier $IC_1$ are connected to ground.

In operation, amplifier $IC_1$ and capacitor $C_1$ generally function as an integrator of signal applied to resistor $R_0$. Resistors $R_1$ and $R_3$ limit the frequency response of integrator circuit 216 and prevent the offset voltage of amplifier $IC_1$ from saturating the output of amplifier $IC_1$. Resistor $R_2$ and capacitor $C_2$ provide a very small time constant so that integrator circuit 216 is operational at frequencies of a fraction of a hertz. The low frequency response provides low phase error for applied frequencies of 50–60 Hz.

Core 114 and winding 116, as shown in FIG. 3, provide a high degree of rejection to stray magnetic fields if winding 116 and the magnetic properties of core 114 are uniform and homogeneous. Incomplete layers, particularly in sense winding 116, will result in sensitivity to external magnetic fields, causing errors in the intended function of the current sensor. Therefore, careful attention to the winding process is required. Electrostatic shield winding 118 is wound over the outside of sensing winding 116.

The details of winding 116 depend on the type of the winding specified. There are three configurations of winding 116 referred to as D1, D2, and D3, respectively. D1, D2, and D3 all have four layers wound in such a way as to obtain an auto-compensating configuration as depicted and summarized below. Compensating turns are used for the rejection of magnetic fields that have a component orthogonal to the plane of windings D1, D2, and D3.

Figure 17:
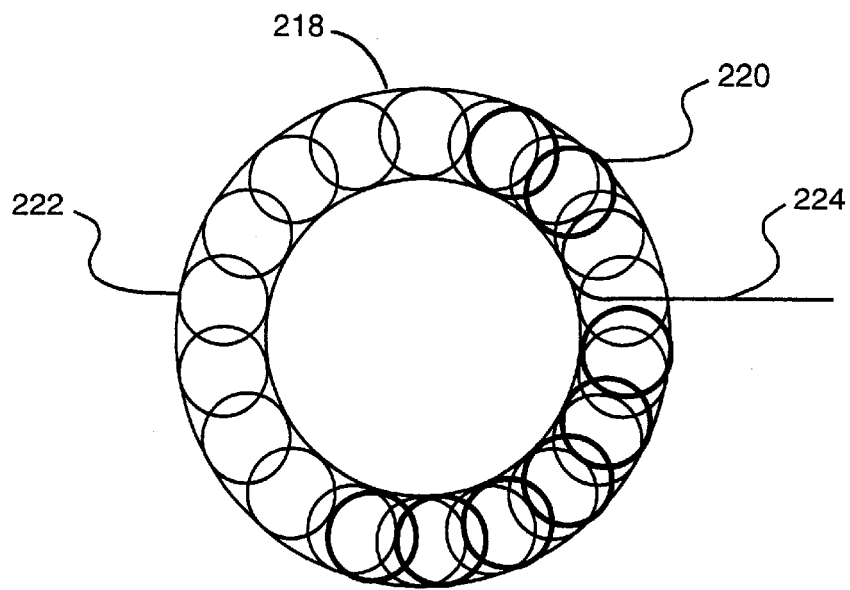
FIG. 17 is a schematic illustration of the sensing core shown in FIG. 1 including two windings.

FIG. 17 illustrates a four layer winding 218 including a second layer 220 wound in the same direction as a first layer 222, but having the bobbin rotated in a direction opposite to that of first layer 222. The start and finish ends (not shown) of first layer 222 and the start end (not shown) of second layer 220 are buried within the winding. A finish end 224 of second layer 220 extends from winding 218. The shuttle holding the wire spool rotates in the same direction for all layers. This approach guarantees that the signals from layers 220, 222 are additive. Second layer 220 automatically forms a compensating turn since the wire and the connection are brought to a point 222. In this configuration, however, the compensation turns are much closer to the windings of first layer 222 than in the case of a single turn of wire in the inside perimeter of the bobbin. In the case of two layers wound as described above, the composite effects of pitch advancement are largely reduced. When many layers are added to a Rogowski coil, the adverse effects of individual turn-to-turn variations and the pitch advance composition effects tend to average to zero or a low value. This generally leads to improved performance with regard to positionally related errors. The remaining two layers are obtained by extending the above procedure. This is not shown in FIG. 17 for clarity.

The D1 winding (not shown) has a nominal 1500 turns of #34 American Wire Gauge (AWG) enameled copper wire. The winding is applied as four precision uniform layers, with each layer, including the last layer, being fully wound as far as is practicable while still keeping the number of turns within specification. The number of turns for each layer is detailed in Table 6.

TABLE 6

| | |
|---|---|
| $N_1$ | 420 T |
| $N_2$ | 370 T |
| $N_3$ | 360 T |
| $N_4$ | 350 T |
| $N_{Total}$ | 1500 T |

The start and finish ends of the inner winding and start end of the outer winding may be "wound in" or "buried" during the winding process. The precision uniform winding is obtained by assuring that the individual turns are abutting with no overlaps. In one embodiment, a thin mylar tape (not shown) is located between each layer. The number of winding turns is approximately 1500±5, and the winding resistance (ac) is approximately 54±4 ohms at 25° C.

The D2 winding (not shown) has a nominal 1580 turns of #34 AWG enameled copper wire. The D2 winding is applied as four uniform layers, with each layer, including the last layer, being fully wound as far as is practicable while still keeping the number of turns within specification. The number of turns for each layer is detailed in Table 7.

TABLE 7

| | |
|---|---|
| $N_1$ | 395 T |
| $N_2$ | 395 T |
| $N_3$ | 395 T |
| $N_4$ | 395 T |
| $N_{Total}$ | 1580 T |

The start and finish ends of the inner winding and start end of the outer winding may be "wound in" or "buried" during the winding process. The uniform winding is obtained by assuring that the individual turns are abutting with no overlaps as much as possible. In one embodiment, the number of winding turns is approximately 1580±5 and the winding resistance (ac) is approximately 56±4 ohms at 25° C.

The D3 winding (not shown) has a nominal 1400 turns of #34 AWG enameled copper wire. The D3 winding is also applied as four uniform layers, including the last layer, being fully wound as far as is practicable while still keeping the number of turns within specifications. The number of turns for each layer is detailed in Table 8.

TABLE 8

| | |
|---|---|
| $N_1$ | 350 T |
| $N_2$ | 350 T |
| $N_3$ | 350 T |
| $N_4$ | 350 T |
| $N_{Total}$ | 1400 T |

The start and finish ends of the inner winding and the start end of the outer winding may be "wound in" or "buried" during the winding process. The uniform winding is obtained by assuring that the individual turns are abutting with no overlaps as much as possible. In one embodiment, the number of winding turns is approximately 1400±5 and the winding resistance (ac) is approximately 46±4 ohms at 25° C.

Electrostatic shield winding 118 has a nominal 350 turns of #34 AWG enameled copper wire. Winding 118 consists of a single layer applied as a uniform layer. A greater tolerance in the number of turns has been provided in this winding to permit improvement in controlling completeness of the layer. The start end of the outer winding may be "wound in" or "buried" during the winding process. In one embodiment, the number of winding turns is approximately 325±35.

The inner and outer windings are wound in the same direction and the self-compensating turns are used for the inner sensing windings. The completed sensor is assembled and terminated to provide the winding polarity specified in FIG. 6.

In order to test winding 116 for shorted turns, and to test the quality of core 114, the inductance and resistance of winding 116 should be measured at 60 Hz. The measured value should have an inductance of about 2.5–3.5 mH and a resistance of about 53–58 W.

Figure 18:
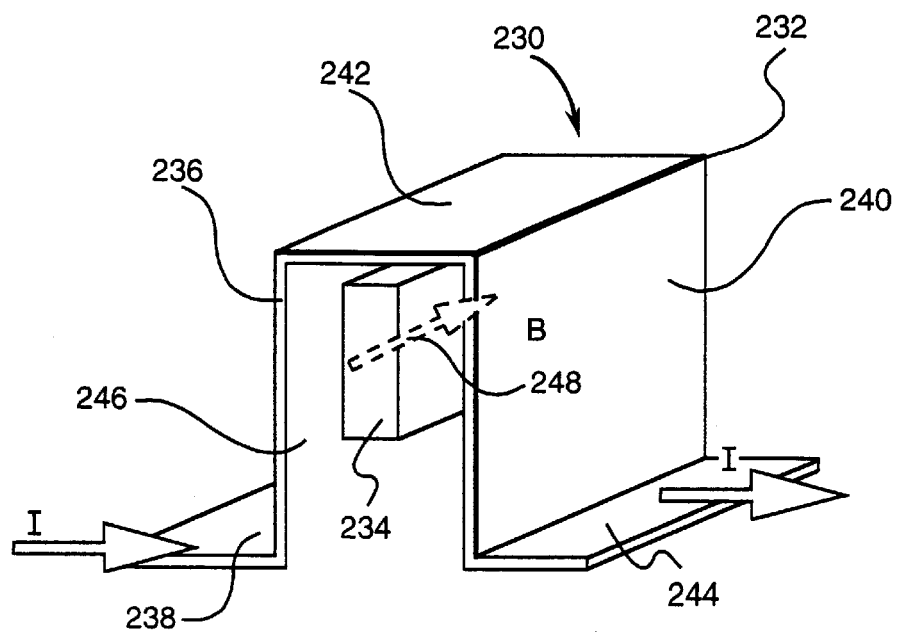
FIG. 18 is a schematic illustration of a current sensor element according to a further embodiment of the present invention.

FIG. 18 is another embodiment and illustrates a current sensor assembly 230. Current sensor assembly 230 includes a current carrying element 232 and a sensor 234. Current-carrying element 232 has a first conductor 236 that receives a current (I) at an input terminal 238. Current I represents the current to be measured by current sensor assembly 230. A second conductor 240 is positioned in spaced relationship relative to first conductor 236 so as to substantially face conductor 236. A third conductor 242 is employed for electrically interconnecting conductors 236 and 240 to form a connected conductive path along conductors 236 and 240. A suitable output terminal 244 is provided for supplying current. Terminals 238, 244 can be conveniently employed for connecting current sensor assembly 230 in series with a predetermined current source (not shown). In one embodiment, conductors 236, 240, 242 are constructed of a suitable conductive material such as copper or a suitable metal alloy. Also, the conductive material can be cast or extruded to form an integral structure such as a U-shaped structure. Alternatively, conductors 236, 240, 242 may instead comprise individual conductors electromechanically connected to one another using suitable joints, or bolts and the like. In addition, lower ampere-rated current sensor assemblies may employ a suitably stamped sheet metal construction. In one embodiment, first and second conductors 236, 240 are positioned substantially parallel relative to one another. Further, first and second conductors 236, 240 are shaped to form respective magnetic field constituents substantially around first and second conductors 236, 240 during current flow along the conductive path.

Current sensor assembly 230 also includes a sensing region 246. Sensing region 246 is that area between conductors 236, 240 where a magnetic field 248 from conductors 236, 240, as well as conductor 242 add to obtain the desired properties listed above.

Sensor 234 functions by using the Lorentz force to bend the direction of current flow based on the magnitude and direction of the magnetic field created by current I to be sensed and shaped by current carrying element 232 as discussed below. Current-carrying element 232 is used to obtain a magnetic field that is proportional to current I as described above.

Figure 19:
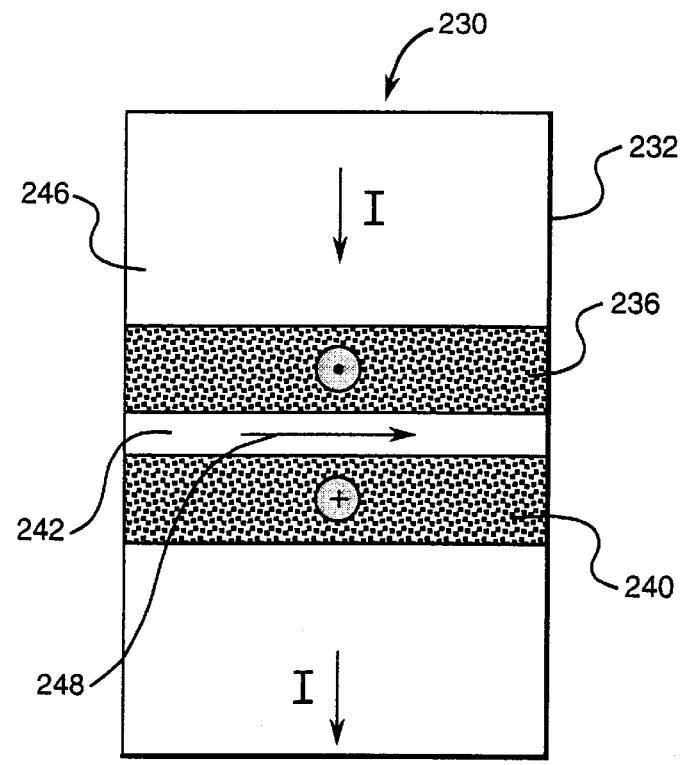
FIG. 19 is a top view of the current sensor element shown in FIG. 18.
Figure 20A:
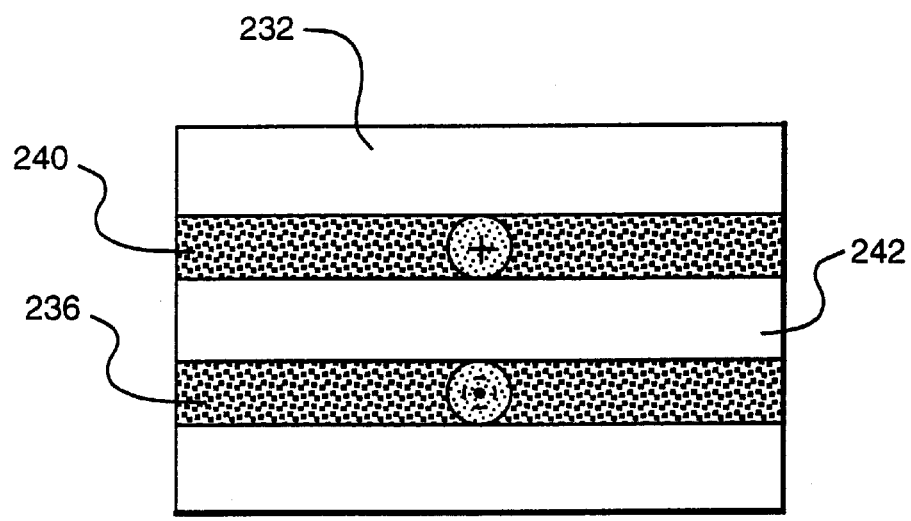
FIG. 20A is a cross sectional view of the current-carrying element shown in FIG. 18.
Figure 20B:
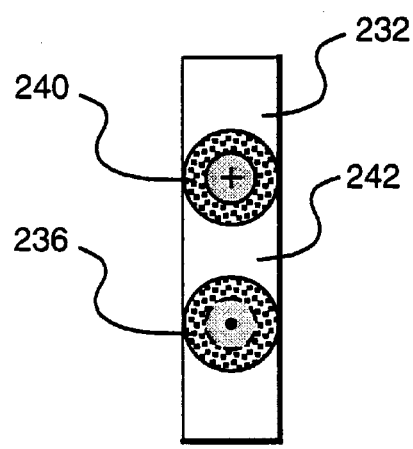
FIG. 20B is an alternative embodiment of the current-carrying element shown in FIG. 18.

FIG. 19 illustrates sensing region 246 of current sensor assembly 230. Magnetic field 248 is substantially constant in magnitude in sensing region 246 of current sensor assembly 230 and substantially constant in direction. Magnetic field 248 is parallel to the two faces of conductors 236, 240, and is substantially constant in the region where sensor 234 is located. FIGS. 20A and 20B illustrate current-carrying element 232 and the direction of current flow through conductors 236, 240. As seen in FIG. 20A, the cross section of conductors 236, 240 can be rectangular. Alternatively, as seen in FIG. 20B, the cross section of conductors 236, 240 can be circular.

Figure 21:
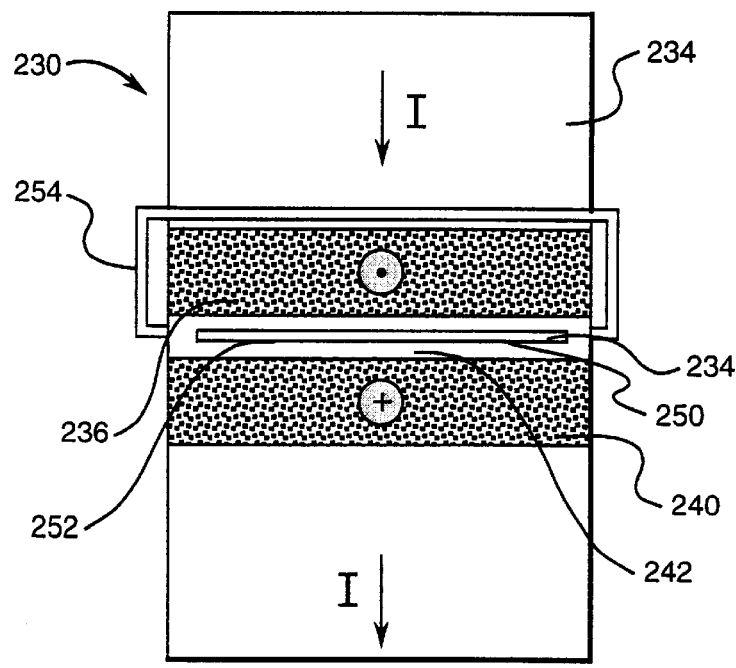
FIG. 21 is a top view of the current sensor assembly according to another embodiment of the invention.

FIG. 21 is a top view of current sensor assembly 230 including first conductor 236, second conductor 240, third conductor 242, and sensor 234. Current sensor assembly 230 also includes an electrostatic shield 250 obtained by covering or enclosing sensor 234 with a conducting shell or outer layer 252. Conducting shell 252 must consist of a material with a magnetic permeability equal to that of air. Conducting shell 252 may be fabricated from a flex circuit or an appropriate electrically insulating material coated by a thin layer of copper or otherwise conducting layer. For example, the appropriate material could be polyimide with a thin layer of copper on one side. Alternatively, conducting shell 252 could be fabricated from kapton with a thin layer of copper.

Figure 22:
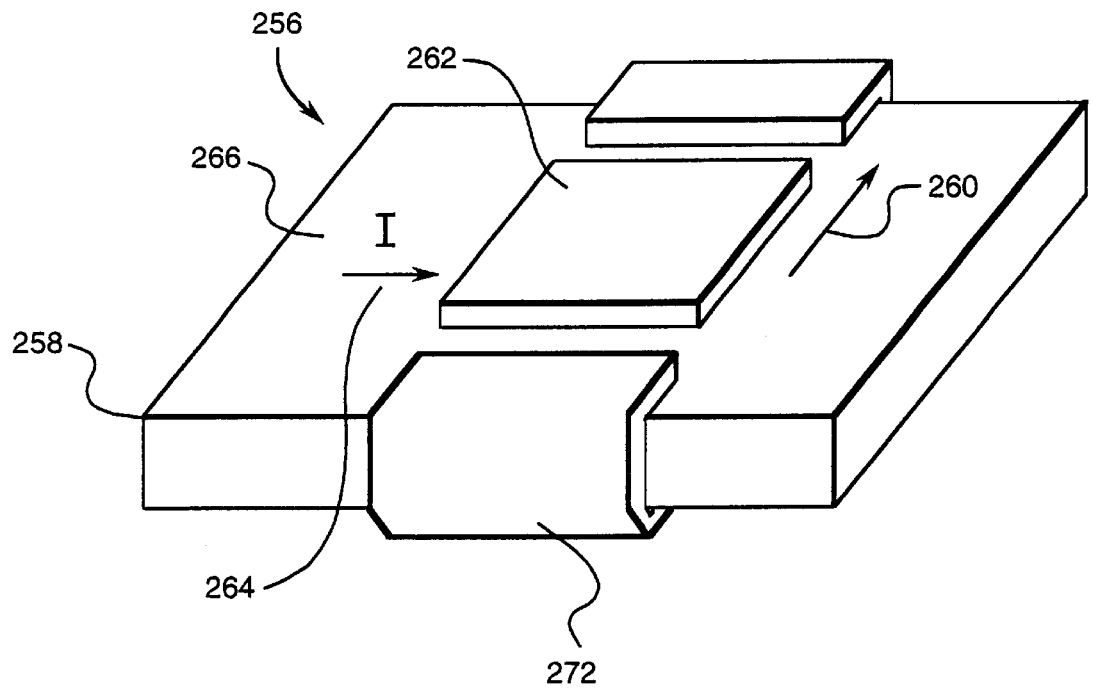
FIG. 22 is a perspective view of a current-carrying element according to a further embodiment of the present invention.

Alternatively, a magnetic flux concentrator 254, as shown in FIG. 22, is used with sensor 234 in the case of weak magnetic fields or magnetically noisy environments. Magnetic flux concentrator 254 is fabricated of a material of sufficiently high magnetic permeability such as silicon steel, ferrite, or $\mu$-metal. Magnetic flux concentrator 254 is positioned at least partially about one of conductors 236, 240, 242. In one embodiment, magnetic flux concentrator 254 is positioned on conductor 236 adjacent sensor 234. Magnetic flux concentrator 254 is oriented on conductor 236 such that at least three sides of conductor 236 are covered. The remaining side of conductor 236 is positioned in close proximity to sensor 234 to allow sensor 234 to detect the concentrated magnetic flux. Magnetic flux concentrator 254 is a relatively flat sheet that has been bent to conform to the shape of conductor 236.

Figure 23:
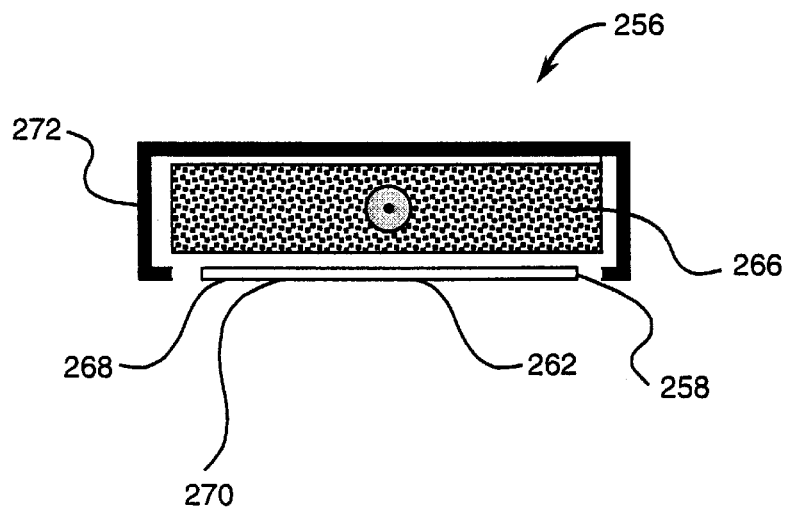
FIG. 23 is a cross sectional view of the current-carrying element shown in FIG. 22.

FIGS. 22 and 23 illustrate another current sensor assembly 256 including a current-carrying element 258 used to shape a magnetic field 260. Current-carrying element 258 is used to produce magnetic field 260 which is proportional to current I to be sensed, substantially constant in magnitude in a preferred sensing region 264, and substantially constant in direction in preferred region 264. Current-carrying element 258 is obtained by using a current conductor 266 of substantially rectangular cross section and of substantially large aspect ratio.

FIG. 23 illustrates current-carrying element 258 including an electrostatic shield 268 covering or enclosing sensor 262 with a conducting shell or outer layer 270. In one embodiment, conducting shell 270 is fabricated from a material having a magnetic permeability equal to that of air. Conducting shell 270 can be obtained from a flex circuit or an appropriate insulating material, e.g., polyimide, coated by a thin layer of copper or other conducting layer. Alternatively, conducting shell 270 can be fabricated from Kapton with a thin layer of copper. Sensor 262 can be a semiconductor or a solid state sensor.

In an alternative embodiment, a magnetic flux concentrator 272 is used with sensor 262 in the case of weak magnetic fields and magnetically noisy environments. Magnetic flux concentrator 272 is fabricated from a material of sufficiently high magnetic permeability such as silicon steel, ferrite, or $\mu$-metal. Magnetic flux concentrator 272 is positioned at least partially about conductor 266. In one embodiment, magnetic flux concentrator 272 is positioned on conductor 266 in the same region of conductor 266 that is adjacent to sensor 262. Magnetic flux concentrator 272 is oriented on conductor 266 such that at least three sides of conductor 266 are covered. The remaining side of conductor 266 is positioned in close proximity to sensor 262 to allow sensor 262 to detect the concentrated magnetic flux. Magnetic flux concentrator 272 is a relatively flat sheet bent to conform to the shape of conductor 266.

The current sensor assemblies described herein may be used in electronic residential meters intended for out-of-doors as well as indoors mounting. Such meter can be enclosed in a glass or polycarbonate cover and be provided with an internal sun shield to protect the internal parts from direct solar radiation. Expected extremes of operating temperature for the current sensor are: −40° C. to +85° C.

The meter is not hermetically sealed and occasionally condensation can occur on internal parts. A minimum temperature rise of 5° C. between the current sensors and the external ambient ensures a low probability of condensation occurring on the sensors. The expected average operating temperature of the current sensor is 45° C., based on daily and seasonal changes in ambient environment and meter load current.

The current sensor assembly described above provides a semiconductor-based sensor that is responsive to magnetic fields in the plane of the chip. The sensor assembly is sized to be readily interchanged with existing current sensors used in meters, circuit breakers, and various monitoring equipment and electronics providing for easy replacement.

While only certain preferred features of the invention have been illustrated and described, many modifications and changes will occur to those skilled in the art. It is, therefore, to be understood that the appended claims are intended to cover all such modifications and changes as fall within the true spirit of the invention.

What is claimed is:

1. A current sensor assembly comprising:
   at least one conductor;
   a current sensor spaced apart from said conductor, said current sensor comprising a substantially cylindrical core including at least one winding having a substantially toroidal shape; and
   an electrostatic shield winding is sensing around winding to form an electrostatic shield coil;
   an electrostatic shield surrounding said current sensor;
   wherein said sensor surrounds said conductor.

2. A sensor assembly in accordance with claim 1 further comprising a housing and a magnetic shield, said housing positioned around said sensor and said magnetic shield positioned around said housing.

3. A sensor assembly in accordance with claim 2 wherein said sensor, said housing, said magnetic shield, and said electrostatic shield are of toroidal symmetry and arranged coaxially about said conductor.

4. A sensor assembly in accordance with claim 3 wherein said at least one conductor comprises two conductors disposed symmetrically with respect to the remaining sensor assembly.

5. A sensor assembly in accordance with claim 5 wherein said conductors are disposed concentrically with respect to the remaining toroidal assembly.

6. A sensor assembly in accordance with claim 3 wherein said at least one conductor comprises two conductors disposed asymmetrically with respect to the remaining sensor assembly.

7. A sensor assembly in accordance with claim 6 wherein said conductors are disposed side-by-side such that a center of a line joining centers of said conductors is approximately at a geometric center of the remaining toroidal assembly.

8. A sensor assembly in accordance with claim 2 wherein said core is an air core.

9. A current sensor assembly in accordance with claim 1 further comprising a registration unit for maintaining said conductor in registration with respect to said housing.

10. A sensor assembly in accordance with claim 9 wherein said housing includes at least one projection, said registration unit connected to said housing by said project.

11. A sensor assembly in accordance with claim 1 wherein said winding comprises a four layer winding.

12. A current sensor assembly comprising:
    at least one conductor;
    a solid state current sensor;
    a sensing region; and
    an electrostatic shield surrounding said one conductor;
    wherein said electrostatic shield comprises a conducting shell that at least partially encloses said solid state sensor;
    wherein said at least one conductor is disposed to form a generally U shaped structure;
    wherein said solid state current sensor is disposed within said at least one conductor so as to form said sensing region.

13. A sensor assembly in accordance with claim 12 further comprising a magnetic flux concentrator as least partially surrounding said one conductor.

14. A sensor assembly in accordance with claim 13 wherein said magnetic flux concentrator comprises at least one of the group consisting of silicon steel, ferrite, and $\mu$-metal.

15. A sensor assembly in accordance with claim 12 wherein said conducting shell comprises at least one of the group consisting of a flex circuit and an insulating material coated by a thin layer of copper.

16. A sensor assembly in accordance with claim 12 wherein said conductor has a rectangular cross section.

17. A sensor assembly in accordance with claim 12 wherein said conductor has a circular cross section.

* * * * *